United States Patent
Yoshikawa et al.

(10) Patent No.: US 8,980,503 B2
(45) Date of Patent: Mar. 17, 2015

(54) BINARY PHOTOMASK BLANK AND BINARY PHOTOMASK MAKING METHOD

(75) Inventors: Hiroki Yoshikawa, Joetsu (JP); Yukio Inazuki, Joetsu (JP); Kazuhiro Nishikawa, Joetsu (JP); Hideo Kaneko, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 6 days.

(21) Appl. No.: 13/196,952

(22) Filed: Aug. 3, 2011

(65) Prior Publication Data

US 2012/0034551 A1    Feb. 9, 2012

(30) Foreign Application Priority Data

Aug. 4, 2010   (JP) .................................. 2010-175230

(51) Int. Cl.
  *G03F 1/50*   (2012.01)
  *G03F 1/76*   (2012.01)
  *G03F 1/00*   (2012.01)
  *G03F 1/58*   (2012.01)
  *G03F 1/32*   (2012.01)

(52) U.S. Cl.
  CPC .. *G03F 1/14* (2013.01); *G03F 1/58* (2013.01); *G03F 1/32* (2013.01)
  USPC ........................................................... 430/5

(58) Field of Classification Search
  CPC ..................................... G03F 1/50; G03F 1/76
  USPC ....................................................... 430/4–5
  See application file for complete search history.

(56) References Cited

U.S. PATENT DOCUMENTS

| | | |
|---|---|---|
| 5,474,864 A | 12/1995 | Isao et al. |
| 7,625,676 B2 | 12/2009 | Yoshikawa et al. |
| 7,691,546 B2 | 4/2010 | Yoshikawa et al. |
| 7,767,367 B2 | 8/2010 | Yoshikawa et al. |
| 8,221,941 B2 | 7/2012 | Suzuki et al. |
| 2006/0088774 A1 | 4/2006 | Yoshikawa et al. |
| 2007/0212619 A1* | 9/2007 | Yoshikawa et al. ............... 430/5 |
| 2008/0063950 A1* | 3/2008 | Yoshikawa et al. ............... 430/5 |
| 2010/0081066 A1* | 4/2010 | Nozawa ........................... 430/5 |
| 2010/0167185 A1 | 7/2010 | Suzuki et al. |

FOREIGN PATENT DOCUMENTS

| | | |
|---|---|---|
| JP | 7-140635 A | 6/1995 |
| JP | 2003-195479 A | 7/2003 |
| JP | 2006-78807 A | 3/2006 |
| JP | 2006-146151 A | 6/2006 |
| JP | 1801647 A1 | 6/2007 |
| JP | 2007-241060 A | 9/2007 |
| JP | 1832926 A2 | 9/2007 |
| JP | 1832926 A3 | 12/2007 |
| JP | WO 2008/139904 A1 | 11/2008 |
| JP | 2010-156880 A | 7/2010 |

* cited by examiner

*Primary Examiner* — Christopher Young

(74) *Attorney, Agent, or Firm* — Birch, Stewart, Kolasch & Birch, LLP

(57) ABSTRACT

A binary photomask blank has on a transparent substrate a light-shielding film including substrate-side and surface-side compositionally graded layers, having a thickness of 35-60 nm, and composed of a silicon base material containing a transition metal and N and/or O. The substrate-side compositionally graded layer has a thickness of 10-58.5 nm, and a N+O content of 25-40 at % at its lower surface and 10-23 at % at its upper surface. The surface-side compositionally graded layer has a thickness of 1.5-8 nm, and a N+O content of 10-45 at % at its lower surface and 45-55 at % at its upper surface.

19 Claims, 3 Drawing Sheets

BINARY PHOTOMASK BLANK AND BINARY PHOTOMASK MAKING METHOD

CROSS-REFERENCE TO RELATED APPLICATION

This non-provisional application claims priority under 35 U.S.C. §119(a) on Patent Application No. 2010-175230 filed in Japan on Aug. 4, 2010, the entire contents of which are hereby incorporated by reference.

TECHNICAL FIELD

This invention relates to a binary photomask blank and a method for preparing a binary photomask from the binary photomask blank. The binary photomask is used in the microfabrication of semiconductor integrated circuits, charge coupled devices (CCD), liquid crystal display (LCD) color filters, magnetic heads or the like, typically by ArF lithography.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Thus, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography used in a semiconductor processing step using a photomask.

A photomask pattern is generally formed by forming a photoresist film on a photomask blank having a light-shielding film on a transparent substrate, writing a pattern using electron beam, and developing to form a resist pattern. Using the resulting resist pattern as an etch mask, the light-shielding film is etched into a light-shield pattern. In an attempt to miniaturize the light-shield pattern, if processing is carried out while maintaining the thickness of the resist film at the same level as in the art prior to the miniaturization, the ratio of film thickness to pattern width, known as aspect ratio, becomes higher. As a result, the resist pattern profile is degraded, preventing effective pattern transfer, and in some cases, there occurs resist pattern collapse or stripping. Therefore, the thickness of resist film must be reduced to enable miniaturization.

As to the light-shielding film material to be etched through the resist pattern as etch mask, a number of materials are known in the art. Among others, chromium compound films are used in practice because many teachings about etching are available and their processing has been established as the standard process. For example, a photomask blank having a light-shielding film composed of a chromium compound suited for ArF excimer laser lithography is disclosed in JP-A 2003-195479. Specifically a chromium compound film having a thickness of 50 to 77 nm is described.

A typical dry etching process for chromium base films such as chromium compound films is oxygen-containing chlorine gas dry etching, which has a certain etching ability relative to organic film. Thus, when etching is conducted through a thinner resist film in order to transfer a finer size pattern for the above-described reason, the resist film can be damaged during etching. It is then difficult to transfer the resist pattern accurately. To meet both the requirements of miniaturization and accuracy, it becomes necessary to investigate the light-shielding material again so as to facilitate the processing of light-shielding film, rather than the current trend relying solely on resist performance improvement.

For example, JP-A 2006-78807 discloses a light-shielding film including at least one layer of a material mainly containing silicon and a transition metal wherein an atomic ratio of silicon:metal is 4-15:1. The light-shielding film has improved light shielding performance and ease of processing and is suited for the ArF lithography. Also JP-A 2007-241060 discloses a photomask blank including a light-shielding film containing silicon and a transition metal and a thin film of chromium base material as a hard mask film, with the advantage of high accuracy processing.

As described above, a light-shielding film which can be processed under conditions which cause less damages to the resist pattern is necessary in order to form a finer size pattern accurately. In the case of a photomask blank including a light-shielding film containing silicon and a transition metal as elements for providing a transmittance reducing function and optionally low atomic weight elements such as nitrogen and oxygen and a chromium base hard mask film, proposed in JP-A 2007-241060, one effective means for reducing the load to the resist is by reducing the thickness of the light-shielding film itself as well as the thickness of the hard mask film. In this case, particularly on the light-shielding film side, the concentration of low atomic weight elements added to the material such as nitrogen and oxygen is minimized in order to derive a better light shielding effect from a thin film. That is, a so-called highly metallic film is used as the light-shielding film.

On use in the exposure tool, the photomask is mounted in the exposure tool such that the pattern-bearing surface may face the object to be exposed (e.g., silicon wafer). Upon exposure, exposure light is incident on the surface of the transparent substrate opposite to the pattern-bearing surface, i.e., substrate surface, and transmitted by the transparent substrate. The component of light that has passed the region of the pattern-bearing surface where the light-shielding pattern is absent reaches the resist film whereby the resist film is exposed to light patternwise.

At this point, it is known that a ghost pattern is created by the mechanism that the exposure light is reflected by the surface of a substrate to be exposed (e.g., silicon wafer) which is coated with the resist film and the reflected light is reflected again by the light-shielding pattern of the photomask and reaches the resist film again. Thus an antireflective coating is generally formed on the light-shielding film of the photomask for controlling the reflectance of the photomask.

On the other hand, it is also contemplated that a component of incident light entering the transparent substrate surface is reflected by the interface between the light-shielding film and the transparent substrate, and the reflected light is reflected again by the surface of the transparent substrate (interface between the transparent substrate and the surrounding atmosphere), passes through the light-shielding pattern-free region and reaches the resist film. For example, when the light-shielding film is entirely formed as an all metal film completely free of light elements in order to minimize the thickness of light-shielding film, the reflectance of exposure light of wavelength 193 nm at the interface between the light-shielding film and the transparent substrate reaches a value in excess of 50%, with the risk of creating a ghost pattern. Particularly when the exposure tool uses an oblique incidence illumination system such as modified illumination, there is a strong possibility that the exposure light reflected again will pass through the light-shielding pattern-free region, which makes the problem more serious. Then WO 2008/139904 proposes that an antireflective coating capable of attenuating reflected light by utilizing multiple reflection is formed on the back surface side to reduce reflectance.

However, this antireflective film must be designed such that the film thickness multiplied by refractive index may approximate to a quarter of the exposure wavelength and it may have a certain transmittance, before the antireflective film can fully exert its function. In order that the antireflective film approach attain a necessary degree of light shielding and a low reflectance, the overall film must be thicker. Then the etching time during pattern transfer is accordingly increased. As a result, the resist pattern or hard mask pattern serving as the etch mask during etching process must be thick, which is disadvantageous in forming a finer size pattern at a high accuracy. Further, when an antireflective layer is formed, a difference in etching rate during dry etching arises from the compositional difference thereof from the light-shielding film, resulting in the light-shielding film pattern being stepped or distorted on its sidewall.

CITATION LIST

Patent Document 1: JP-A 2003-195479
Patent Document 2: JP-A 2006-078807 (U.S. Pat. No. 7,691,546, EP 1801647)
Patent Document 3: JP-A 2007-241060 (U.S. Pat. No. 7,767,367, EP 1832926)
Patent Document 4: WO 2008/139904
Patent Document 5: JP-A H07-140635

SUMMARY OF INVENTION

While a photomask blank from which a photomask is manufactured is provided with optical functional films such as a light-shielding film and a phase shift film, these optical films must meet the physical properties necessary for the photomask, especially optical properties and chemical stability. The optical films must also be improved in processability in order to facilitate formation of a high accuracy mask pattern. With the advances of the photolithography toward the size reduction of the desired pattern, the mask is also required to have a pattern of finer size and higher accuracy.

When a fine size, high accuracy pattern is formed from an inorganic material film, the thickness of the inorganic material film to be processed is preferably reduced as long as necessary physical properties are maintained. This is because the thickness of a resist film must be relatively thin in order that the resist pattern used upon processing have a higher accuracy, as mentioned above, and high accuracy pattern transfer becomes possible by minimizing the load in pattern transfer to the inorganic material film by a dry etching or similar technique using the resist pattern resulting from the resist film.

Since the light-shielding film containing silicon and a transition metal as an element for providing a transmittance damping function, described in JP-A 2007-241060, has a high shielding ability to light having a wavelength of up to 200 nm and can be etched under fluorine base dry etching conditions, a relatively preferred etching ratio relative to organic material used as the resist material during lithography is established. Even on use of such material, reducing the thickness of the light-shielding film while maintaining light-shielding function is still effective in securing a process accuracy. In an attempt to produce a binary photomask with a high accuracy, for example, further reducing the thickness of the light-shielding film is desirable.

In order to reduce the thickness of a light-shielding film while maintaining sufficient light-shielding function, the content of light elements such as nitrogen and oxygen must be reduced to render the film more metallic so that the film may have a higher absorption coefficient relative to exposure light. In the exposure tool, the photomask is mounted with its light-shielding pattern-bearing surface facing the resist film-bearing surface of a substrate (to be exposed). If the light-shielding pattern surface is of a more metallic material, its reflectance relative to exposure light becomes higher. There is the risk of forming a ghost pattern during exposure by the mechanism that exposure light reflected by the resist film-bearing surface of a substrate (to be exposed) is reflected again by the mask surface (surface of the photomask pattern or transparent substrate), whereupon it is directed to the resist film again. The reflection on the photomask surface is referred to as "front surface reflection."

On the other hand, on the transparent substrate side of the photomask, there is a risk of forming a ghost pattern as a result of exposure light incident on the transparent substrate side being reflected by the interface between the light-shielding film and the transparent substrate, then reflected again by the interface between the transparent substrate and the photomask-surrounding gas and eventually directed to the resist film. These reflections at the interface between the light-shielding film and the transparent substrate and the interface between the transparent substrate and the ambient gas are referred to as "back surface reflection." Especially in an illumination technique using the majority of oblique incident component of exposure light to provide a high resolution, for example, the immersion lithography, even at a thickness of the order corresponding to a transparent substrate used in the photomask, there is an increased risk that the reflected light resulting from the back surface reflection passes through the light-shielding pattern-free region and reaches the resist film. Thus, when a highly metallic film is used as the light-shielding film in order to substantially reduce the thickness of the light-shielding film, it is recommended to take any means for controlling not only the reflectance on the front surface side, but also the reflectance at the interface between the light-shielding film and the transparent substrate.

However, when an antireflective film for damping reflected light using a phase difference between multiple reflected light within the film is provided between the light-shielding film and the transparent substrate as in WO 2008/139904, the total of this antireflective film and the light-shielding film reaches a substantial thickness. This is because the antireflective film of this type is designed in compliance with the wavelength of exposure light and must have a certain transmittance, and because the light-shielding film is increased in thickness to provide a sufficient light-shielding ability. Furthermore, upon patterning, a difference in etching rate arises between the antireflective film and the light-shielding film under the same dry etching conditions because of different film composition, resulting in a pattern of undesired sidewall profile.

An object of the invention is to provide a binary photomask blank including a thinner light-shielding film which can control a ghost pattern by fully reducing the reflectances on opposite surfaces of a substrate to a practically acceptable level, and fully shield exposure light, and a method for preparing a binary photomask.

The inventors have found the following. It is desired to find a compromise between the thickness of the light-shielding film and the reflectances at the front and back surfaces which encounter a trade-off in principle when the light-shielding film is extremely thin, to reduce the risk of forming a ghost pattern, and to enable high accuracy patterning. The light-shielding film is composed of a plurality of layers composed of a silicon base material containing a transition metal and nitrogen and/or oxygen, in which the total content of nitrogen and oxygen is graded in thickness direction of the layer, which layers are stacked at the substrate side and the surface side. The substrate-side layer is thicker than the surface-side layer. Then the reflectance of the light-shielding film composed of a silicon base material containing a transition metal is reduced to a necessary satisfactory level. Eventually, a light-shielding film pattern of high-accuracy controlled profile is obtainable after processing, especially a light-shielding film pattern with fully perpendicular sidewalls is obtainable.

In one aspect, the invention provides a binary photomask blank including a transparent substrate and a light-shielding film thereon having an optical density of 2.5 to 3.5. The light-shielding film includes a substrate-side compositionally graded layer disposed contiguous to the substrate and a surface-side compositionally graded layer disposed remote from the substrate, has a thickness of 35 to 60 nm, and is composed of a silicon base material containing a transition metal and nitrogen and/or oxygen.

The substrate-side compositionally graded layer is a layer having a thickness of 10 to 58.5 nm in which the total content of nitrogen and oxygen increases in thickness direction toward the substrate; the substrate-side compositionally graded layer includes a layer whose composition varies continuously in thickness direction, a combination of at least three layers each having a consistent composition, a combination of a layer having a consistent composition with a layer whose composition varies continuously in thickness direction, or a combination of layers whose composition varies continuously in thickness direction; the silicon base material of which the substrate-side compositionally graded layer is composed contains a transition metal and silicon in an atomic ratio from 1:2 to 1:9, the total content of nitrogen and oxygen in said substrate-side compositionally graded layer is 25 to 40 atom % at its surface contiguous to the substrate and 10 to 23 atom % at its surface remote from the substrate.

The surface-side compositionally graded layer is a layer having a thickness of 1.5 to 8 nm in which the total content of nitrogen and oxygen decreases in thickness direction toward the substrate; the surface-side compositionally graded layer includes a layer whose composition varies continuously in thickness direction, a combination of at least two layers each having a consistent composition, a combination of a layer having a consistent composition with a layer whose composition varies continuously in thickness direction, or a combination of layers whose composition varies continuously in thickness direction; the silicon base material of which the surface-side compositionally graded layer is composed contains a transition metal and silicon in an atomic ratio from 1:2 to 1:9, the total content of nitrogen and oxygen in said surface-side compositionally graded layer is 10 to 45 atom % at its surface nearer to the substrate and 45 to 55 atom % at its surface remote from the substrate.

In a preferred embodiment, the binary photomask blank may further include an intermediate layer between the substrate-side compositionally graded layer and the surface-side compositionally graded layer, the intermediate layer being composed of a silicon base material containing a transition metal and nitrogen and/or oxygen wherein an atomic ratio of transition metal to silicon is from 1:2 to 1:9, and the total content of nitrogen and oxygen is 10 to 23 atom %.

In a preferred embodiment, the substrate-side compositionally graded layer includes, in part or its entirety of thickness direction, a layer in which the total content of nitrogen and oxygen continuously varies in thickness direction.

In a preferred embodiment, the binary photomask blank may further include a hard mask film of a chromium base material disposed on the light-shielding film.

More preferably, all the layers of the light-shielding film contain at least 3 atom % of nitrogen.

In another aspect, the invention provides a method for manufacturing a binary photomask including the steps of forming a resist film having a thickness of up to 150 nm on the binary photomask blank defined above, processing the resist film into a resist pattern, and forming a mask pattern using the resist pattern.

Advantageous Effects of Invention

The binary photomask blank of the invention has a thinner light-shielding film capable of fully shielding exposure light, so that the reflectances on opposite surfaces of the substrate may be fully reduced to a practically acceptable level, thereby controlling generation of a ghost pattern. When the binary photomask blank is processed using a hard mask of chromium base material, a photomask featuring a very high accuracy is obtainable.

DESCRIPTION OF EMBODIMENTS

The binary photomask blank of the invention is a blank from which a binary photomask including light-transmissive and light-shielding regions is manufactured. It has a light-shielding film having an optical density of no less than 2.5 and no more than 3.5 on a transparent substrate such as a quartz substrate. An area where the light-shielding film is removed and only the transparent substrate is present becomes the light-transmissive region of the binary photomask while an area where the light-shielding film is present or left on the transparent substrate becomes the light-shielding region. Since this light-shielding film is intended for the binary photomask, it should have an optical density of no less than 2.5, preferably no less than 3.0. Since the light-shielding film has a specific layer arrangement to be described later, the film ensures the desired light-shielding function even when the film thickness is no more than 60 nm, specifically no more than 55 nm, and more specifically no more than 50 nm. It is noted that the thickness of the light-shielding film is at least 35 nm.

Figure 1A:
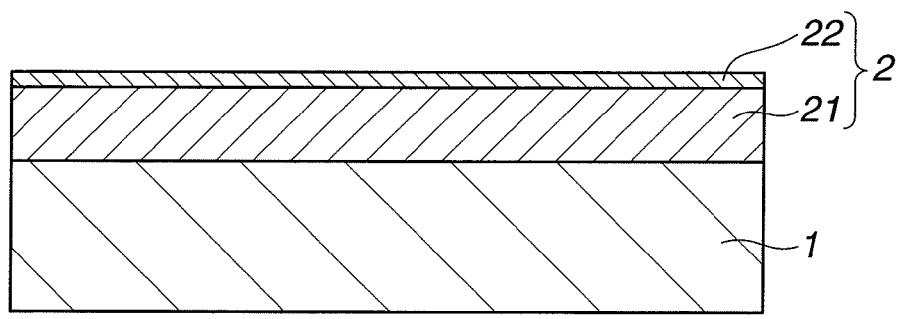
FIG. 1 illustrates in cross-sectional view exemplary binary photomask blanks in different embodiments of the invention, FIG. 1A showing a light-shielding film consisting of a substrate-side compositionally graded layer and a surface-side compositionally graded layer and FIG. 1B showing a light-shielding film consisting of a substrate-side compositionally graded layer, an intermediate layer, and a surface-side compositionally graded layer.

As shown in FIG. 1, the binary photomask blank has a light-shielding film 2 formed on a transparent substrate 1. In one embodiment, as shown in FIG. 1A, the light-shielding film 2 includes a substrate-side compositionally graded layer 21 and a surface-side compositionally graded layer 22 stacked in the described order on the transparent substrate 1. In another embodiment to be described later, an intermediate layer may intervene between the substrate-side and surface-side compositionally graded layers. While the intermediate layer should have a light-shielding function, other functions and its structure are not particularly limited. The light-shielding film is composed of a silicon base material containing a transition metal such as molybdenum and nitrogen and/or oxygen, specifically a silicon base material containing a transition metal such as molybdenum and nitrogen.

In the binary photomask blank, the light-shielding film has a back or lower surface disposed contiguous to the substrate (substrate-side surface) and a front or upper surface disposed remote from the substrate. The light-shielding film includes compositionally graded layers on the back and front surface sides, in which the total content of nitrogen and oxygen in the film-forming material composition varies in thickness direction. Each compositionally graded layer may be a layer whose composition varies continuously in thickness direction, a combination of multiple layers each having a consistent composition, a combination of a layer having a consistent composition with a layer whose composition varies continuously in thickness direction, or a combination of multiple layers whose composition each varies continuously in thickness direction. The compositionally graded layers are stacked in the above arrangement to construct the film having an absorption coefficient which varies continuously or discontinuously in thickness direction. It is noted that the "thickness direction" of a layer refers to a direction perpendicular to the opposed surfaces of the layer.

The substrate-side compositionally graded layer may be a layer whose composition varies continuously in thickness direction, a combination of at least three layers each having a consistent composition, a combination of a layer having a consistent composition with a layer whose composition varies continuously in thickness direction, or a combination of layers whose composition each varies continuously in thickness direction. The substrate-side layer whose composition varies continuously in thickness direction has a low absorption coefficient of exposure light at its (lower) surface contiguous to the substrate and a high absorption coefficient of exposure light at its (upper) surface remote from the substrate.

Preferably the substrate-side compositionally graded layer includes as a part of its thickness or as its entirety a layer in which the total content of nitrogen and oxygen continuously varies in thickness direction. The layer of this construction is capable of efficient reflection control at a certain thickness without a substantial drop of light-shielding function.

The substrate-side compositionally graded layer has a thickness of 10 to 58.5 nm, preferably 13 to 53.5 nm, and more preferably 15 to 48.5 nm. When the substrate-side compositionally graded layer is a combination of multiple layers each having a consistent composition, the number of layers is at least 3, and the upper limit is usually up to 20 layers, though not critical. When the substrate-side compositionally graded layer is a combination of a layer having a consistent composition with a layer whose composition varies continuously in thickness direction, or a combination of layers whose composition each varies continuously in thickness direction, the number of layers is at least 2, and the upper limit is usually up to 20 layers, though not critical. Although a gap can be formed during etching at the interface between layers of substantially different composition, the multilayer construction of at least 3 layers each having a consistent composition or the multilayer construction including a layer whose composition varies continuously in thickness direction can prevent gap formation.

The substrate-side compositionally graded layer is composed of a silicon base material containing a transition metal and nitrogen and/or oxygen, specifically containing a transition metal and silicon in a ratio (transition metal:silicon) from 1:2 to 1:9 (atomic ratio), preferably from 1:2 to 1:5 (atomic ratio). Although the silicon base material may further contain light elements such as carbon, the total content of light elements other than nitrogen and oxygen should preferably be up to 3 atom % from the standpoint of quality control. More preferably the total content of light elements other than nitrogen, oxygen, and carbon should not exceed the impurity level.

The total content of nitrogen and oxygen in the substrate-side compositionally graded layer is 25 to 40 atom % at its lower surface contiguous to the substrate and 10 to 23 atom % at its upper surface remote from the substrate. The composition between the opposed surfaces is such that the total content (atom %) of nitrogen and oxygen may vary continuously or discontinuously in thickness direction and increase toward the transparent substrate in thickness direction (or decrease with a distance spaced apart from the substrate) because of the abovementioned layer construction. Of nitrogen and oxygen, it is preferred that nitrogen be contained in an amount of at least 3 atom %, more preferably at least 5 atom % because side etching can be prevented even when a hard mask film of a chromium base material used in mask processing is removed by chlorine dry etching.

The substrate-side compositionally graded layer is formed thick as compared with the surface-side compositionally graded layer to be described later. Then the light-shielding film can be controlled to have a reflectance of up to 40%, preferably up to 35% on both the front and back surfaces.

Figure 1B:
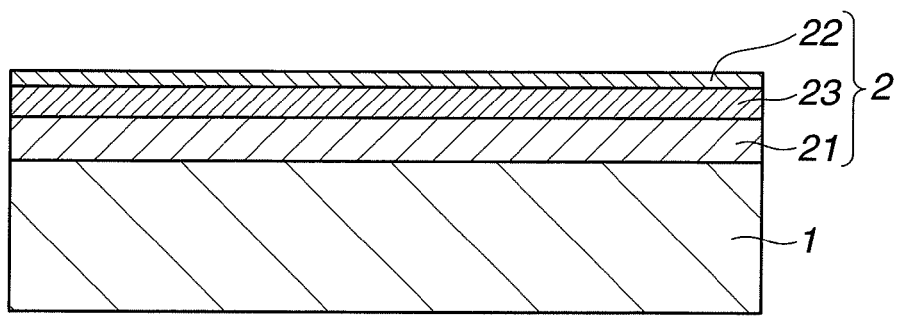

Although the light-shielding film consists of a substrate-side compositionally graded layer and a surface-side compositionally graded layer in one embodiment, an intermediate layer may intervene between these layers in another embodiment. As shown in FIG. 1B, a light-shielding film 2 is formed on a transparent substrate 1, and the light-shielding film 2 includes a substrate-side compositionally graded layer 21 disposed contiguous to the substrate, a surface-side compositionally graded layer 22 disposed remote from the substrate, and an intermediate layer 23 disposed therebetween.

The intermediate layer may be a layer whose composition varies continuously in thickness direction. The intermediate layer near its lower surface (substrate-side surface) may have a total content of nitrogen and oxygen varying at a gradient reverse to the substrate-side compositionally graded layer and near its upper surface may have a total content of nitrogen and oxygen varying at a gradient reverse to the surface-side compositionally graded layer. The intermediate layer is preferably a layer having a less changing composition, more preferably a consistent composition. The intermediate layer is also composed of a silicon base material containing a transition metal and nitrogen and/or oxygen, specifically containing a transition metal and silicon in a ratio (transition metal:silicon) from 1:2 to 1:9 (atomic ratio), preferably from 1:2 to 1:5 (atomic ratio). Although the silicon base material may further contain light elements such as carbon, the total content of light elements other than nitrogen and oxygen should preferably be up to 3 atom % because the light elements serve to reduce the absorption coefficient of exposure light. More preferably the total content of light elements other than nitrogen, oxygen, and carbon should not exceed the impurity level.

The total content of nitrogen and oxygen in the intermediate layer is preferably 10 to 23 atom %, more preferably 10 to 15 atom %. A total content of nitrogen and oxygen within the range allows the film to meet both electro conductivity and chemical stability. Although the content of light elements is preferably minimized in order to provide a high absorption coefficient necessary for the light-shielding film as mentioned above, a total content of nitrogen and oxygen in the intermediate layer is preferably selected within the range for the purpose of obtaining the desired profile upon dry etching, whereby the intermediate layer together with the substrate-side compositionally graded layer and the surface-side compositionally graded layer may form the light-shielding film having a good balance of overall thickness, reflection control function and processability. When used in combination with a hard mask film formed of a chromium base material to be described later, the intermediate layer preferably contains at least 3 atom %, more preferably at least 5 atom % of nitrogen.

The thickness of the intermediate layer is designed in accordance with the necessary optical density of the overall light-shielding film and depending on the composition and thickness of the substrate-side and surface-side compositionally graded layers. In the light-shielding film, the substrate-side compositionally graded layer may have a thickness of at least 40 nm, and in this case, the intermediate layer need not necessarily be provided, and if provided, the intermediate layer having a thickness of about 1 nm may assist in constructing a light-shielding film having an optical density of at least 2.5 despite a thickness of up to 60 nm. The intermediate layer preferably has a thickness of no more than 48.5 nm, more preferably 1 to 43.5 nm, and even more preferably 1 to 38.5 nm.

The surface-side compositionally graded layer which constitutes a portion of the light-shielding film which is disposed on its upper surface side (remotest from the substrate) may be a layer whose composition varies continuously in thickness direction, a combination of at least two layers each having a consistent composition, a combination of a layer having a consistent composition with a layer whose composition varies continuously in thickness direction, or a combination of layers whose composition each varies continuously in thickness direction. The surface-side layer whose composition varies continuously in thickness direction has a high absorption coefficient of exposure light at its (lower) surface adjacent to the substrate and a low absorption coefficient of exposure light at its (upper) surface remote from the substrate.

The surface-side compositionally graded layer has a thickness of 1.5 to 8 nm, preferably 3 to 6 nm. When the surface-side compositionally graded layer is a combination of multiple layers each having a consistent composition, the number of layers is at least 2, and the upper limit is usually up to 5 layers, though not critical. When the surface-side compositionally graded layer is a combination of a layer having a consistent composition with a layer whose composition varies continuously in thickness direction, or a combination of layers whose composition each varies continuously in thickness direction, the number of layers is at least 2, and the upper limit is usually up to 5 layers, though not critical. Although a gap can be formed during etching at the interface between layers of substantially different composition, the multilayer construction of at least 2 layers each having a consistent composition or the multilayer construction including a layer whose composition varies continuously in thickness direction can prevent gap formation. In particular, since the surface-side compositionally graded layer is thinner than the substrate-side compositionally graded layer, even the two-layer construction is fully effective for preventing gap formation during etching. Since the surface-side compositionally graded layer is very thin, a simpler layer construction is preferably used such as a combination of layers having a consistent composition in thickness direction or a layer whose composition varies continuously in thickness direction.

The surface-side compositionally graded layer is composed of a silicon base material containing a transition metal and nitrogen and/or oxygen, specifically containing a transition metal and silicon in a ratio (transition metal:silicon) from 1:2 to 1:9 (atomic ratio), preferably from 1:2 to 1:6 (atomic ratio). Although the silicon base material may further contain light elements such as carbon, the total content of light elements other than nitrogen and oxygen should preferably be up to 3 atom % from the standpoint of quality control. More preferably the total content of light elements other than nitrogen, oxygen, and carbon should not exceed the impurity level.

The total content of nitrogen and oxygen in the surface-side compositionally graded layer is 10 to 45 atom %, preferably 20 to 40 atom % at its lower surface adjacent to the substrate and 45 to 55 atom %, preferably 45 to 50 atom % at its upper surface remote from the substrate. The composition between the opposed surfaces is such that the total content (atom %) of nitrogen and oxygen may vary continuously or discontinuously in thickness direction and decrease toward the transparent substrate in thickness direction (or increase with a distance spaced apart from the substrate) because of the abovementioned layer construction. When used in combination with a hard mask film formed of a chromium base material to be described later, the surface-side compositionally graded layer preferably contains at least 3 atom %, more preferably at least 5 atom % of nitrogen.

A sub-surface portion of the surface-side compositionally graded layer having a thickness of about 1 nm has an oxygen content which may be increased by cleaning treatment and surface oxidation during the manufacture process. Thus the sub-surface portion of the surface-side compositionally graded layer may be excluded from the surface-side compositionally graded layer when the total content of nitrogen and oxygen is determined.

The surface-side compositionally graded layer is formed thin as compared with the substrate-side compositionally graded layer. Then the light-shielding film can be controlled to have a reflectance of up to 40%, preferably up to 35% on both the front and back surfaces.

In the most preferred embodiment, the light-shielding film includes a substrate-side compositionally graded layer of 10 to 40 nm thick, whose composition varies continuously in thickness direction, an intermediate layer of 10 to 35 nm thick, and a surface-side compositionally graded layer of up to 6 nm thick, stacked in the described order on a transparent substrate.

The preferred method for forming the light-shielding film or layers of the light-shielding film is sputtering because a fully homogeneous film can be most easily formed. The sputtering technique may be DC sputtering, RF sputtering or the like, with the DC sputtering being preferred. The technique of depositing a film containing a transition metal and silicon and further nitrogen and/or oxygen by sputtering is well known in the art. Typically the film can be deposited by any well-known technique (see JP-A 2007-241060, for example).

Upon sputtering, there is used a single target in which a ratio of transition metal to silicon has been adjusted so that the deposited film may have a desired ratio of transition metal to silicon. Alternatively a plurality of different targets are used and the powers to the targets are controlled so as to adjust the ratio of transition metal to silicon. The targets used herein include a silicon target containing a transition metal, a combination of a transition metal target with a silicon target, a combination of a silicon target containing a transition metal with a silicon target, a combination of a transition metal target with a silicon target containing a transition metal, or a combination of a transition metal target with a silicon target containing a transition metal and a silicon target.

Suitable sputtering gases include well-known inert gases and reactive gases. Preferably argon gas is used alone or in combination with nitrogen, nitrogen oxide or oxygen gas, the combination being adjusted so as to provide the composition defined above. The absorption coefficient of a light-shielding film may be adjusted by depositing each layer by way of trial, determining sputtering conditions and a deposition rate therefrom, selecting sputtering conditions for the substrate-side compositionally graded layer, intermediate layer, and surface-side compositionally graded layer of a light-shielding film such that the resulting light-shielding film may have the desired light-shielding function, and depositing layers while changing sputtering conditions. When a film whose absorption coefficient changes stepwise or continuously is to be formed, the composition of sputtering gas may be changed stepwise or continuously. When a plurality of targets are used, the powers applied to the targets may be changed stepwise or continuously whereby the ratio of transition metal to silicon is changed stepwise or continuously.

The gas pressure during deposition may be selected as appropriate in consideration of the stress, chemical resistance and cleaning resistance of the resulting film. Typically better chemical resistance is obtained under a pressure of 0.01 to 1 Pa, preferably 0.03 to 0.3 Pa. The power applied to the sputtering target may be selected as appropriate in accordance with the size and cooling efficiency of the target and ease of control of deposition although the power is typically 0.1 to 5 W/cm$^2$.

In the photomask blank of the invention, a hard mask film of a chromium base material (24) may be formed on the light-shielding film, specifically on the upper surface of the surface-side compositionally graded layer, for enabling high accuracy processing of the light-shielding film.

The hard mask film of chromium base material is described in JP-A 2007-241060, for example. For enabling high accuracy processing of the light-shielding film, it is necessary that the hard mask itself can be high accuracy processed. To this end, the hard mask preferably has a thickness of 1 nm to 10 nm and a composition consisting essentially of 50 to 100 atom %, more preferably 60 to 95 atom % of chromium, 0 to 50 atom %, more preferably 0 to 30 atom % of oxygen, 0 to 50 atom %, more preferably 5 to 40 atom % of nitrogen, and 0 to 20 atom %, more preferably 0 to 10 atom % of carbon.

Like the light-shielding film, the hard mask film is preferably deposited by sputtering. The deposition may be by sputtering a chromium target with argon gas alone, or reactive sputtering with a reactive gas such as nitrogen or nitrogen oxide alone, or a mixture of a reactive gas such as nitrogen or nitrogen oxide and an inert gas such as argon, as described in JP-A H07-140635, for example. The flow rate of sputtering gas may be adjusted in accordance with the desired film properties. For example, the flow rate may be set constant throughout the deposition process or varied in accordance with the desired composition such that the oxygen and/or nitrogen content may vary in thickness direction of the film.

Use of the hard mask film of chromium base material enables high accuracy etching. The hard mask film performs more effectively when the silicon base material of which the light-shielding film is formed contains nitrogen, preferably at least 3 atom %, and more preferably at least 5 atom % of nitrogen for all the layers of the film, because the light-shielding film is unsusceptible to shape changes under the dry etching conditions of chromium base material for stripping off the hard mask film.

The binary photomask blank of the invention is best suited in manufacturing a binary photomask for use in the ArF lithography, i.e., exposure to ArF excimer laser light of wavelength 193 nm. A binary photomask may be manufactured from the binary photomask blank of the invention by forming a resist film on the light-shielding film or hard mask film, if provided, processing the resist film to form a resist pattern, etching the light-shielding film or the hard mask film and light-shielding film with the resist pattern serving as an etching mask pattern, and stripping the resist film and/or the hard mask film. The binary photomask blank ensures that the light-shielding film pattern is formed at a high accuracy even when the resist film is very thin, specifically has a thickness of up to 150 nm, more specifically 50 to 120 nm.

EXAMPLE

Examples are given below for further illustrating the invention although the invention is not limited thereto.

Example 1

A light-shielding film of MoSiN consisting of a substrate-side compositionally graded layer and a surface-side compositionally graded layer was deposited on a quartz substrate by a sputtering technique using silicon and molybdenum silicide targets, and argon and nitrogen gases as sputtering gas.

First, a layer having a thickness of 45 nm was deposited as the substrate-side compositionally graded layer while maintaining a Mo:Si ratio of 1:2.5 (atomic ratio) and continuously varying the nitrogen gas concentration such that the nitrogen content was 29 atom % on the substrate side and 19 atom % on the side remote from the substrate. Subsequently, a layer having a thickness of 2 nm was deposited under conditions to provide a Mo:Si ratio of 1:3.5 (atomic ratio) and a nitrogen content of 38 atom %, and a layer having a thickness of 2 nm was deposited under conditions to provide a Mo:Si ratio of 1:3.5 (atomic ratio) and a nitrogen content of 47 atom %, the two layers forming the surface-side compositionally graded layer. In this way, a binary photomask blank was obtained.

The light-shielding film thus obtained had a thickness of 49 nm. With respect to light of wavelength 193 nm, the film had an optical density OD of 3.10, a reflectance of 32% at the substrate side surface, and a reflectance of 34% at the surface remote from the substrate.

Next, a CrN film (Cr:N=9:1 in atomic ratio) having a thickness of 10 nm was deposited on the binary photomask blank by a sputtering technique. A resist material for EB lithography was coated thereon to form a resist film having a thickness of 150 nm. The resist film was exposed to EB and developed to form a line-and-space pattern having a line width of 120 nm. The CrN film was patterned by dry etching using 185 sccm of $Cl_2$ gas, 55 sccm of $O_2$ gas, and 9.25 sccm of He gas as the etchant gas, for thereby transferring the resist pattern to the CrN film. Thereafter, the light-shielding film was dry etched using 18 sccm of $SF_6$ gas and 45 sccm of $O_2$ gas as the etchant gas. Thereafter, the resist pattern and Cr film were removed.

The cross-sectional profile of the light-shielding film pattern thus obtained was observed under SEM. A fully perpendicular cross-section was seen.

Example 2

A light-shielding film of MoSiN consisting of a substrate-side compositionally graded layer, an intermediate layer, and a surface-side compositionally graded layer was deposited on a quartz substrate by a sputtering technique using silicon and molybdenum silicide targets, and argon and nitrogen gases as sputtering gas.

First, a layer having a thickness of 19 nm was deposited as the substrate-side compositionally graded layer while maintaining a Mo:Si ratio of 1:2.5 (atomic ratio) and continuously varying the nitrogen gas concentration such that the nitrogen content was 29 atom % on the substrate side and 19 atom % on the side remote from the substrate. Next, a layer having a thickness of 25 nm was deposited as the intermediate layer under conditions to provide a Mo:Si ratio of 1:2.5 (atomic ratio) and a nitrogen content of 19 atom %. Subsequently, a layer having a thickness of 2 nm was deposited under conditions to provide a Mo:Si ratio of 1:3.5 (atomic ratio) and a nitrogen content of 38 atom %, and a layer having a thickness of 2 nm was deposited under conditions to provide a Mo:Si ratio of 1:3.5 (atomic ratio) and a nitrogen content of 47 atom %, the two layers forming the surface-side compositionally graded layer. In this way, a binary photomask blank was obtained.

The light-shielding film thus obtained had a thickness of 48 nm. With respect to light of wavelength 193 nm, the film had an optical density OD of 3.05, a reflectance of 34% at the substrate side surface, and a reflectance of 34% at the surface remote from the substrate.

Figure 2:
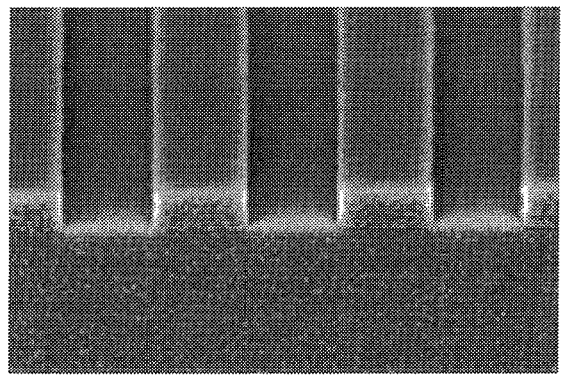
FIG. 2 is a SEM image of a light-shielding film pattern obtained in Example 2.

Next, a light-shielding film pattern was formed by the same procedure as in Example 1 aside from using the binary photomask blank thus obtained, and the cross-sectional profile thereof was observed under SEM. The SEM image is shown in FIG. 2. A fully perpendicular cross-section was confirmed from the SEM observation.

Comparative Example 1

A light-shielding film consisting of three layers was deposited on a quartz substrate by a sputtering technique using silicon and molybdenum silicide targets, and argon and nitrogen gases as sputtering gas.

First, a layer having a thickness of 2 nm was deposited under conditions to provide a Mo:Si ratio of 1:3.5 (atomic ratio) and a nitrogen content of 38 atom %. Next, a layer having a thickness of 35 nm was deposited under conditions to provide a Mo:Si ratio of 1:2.2 (atomic ratio) and a nitrogen content of 0 atom %. Further a layer having a thickness of 5 nm was deposited under conditions to provide a Mo:Si ratio of 1:3.5 (atomic ratio) and a nitrogen content of 38 atom %. In this way, a binary photomask blank was obtained.

The light-shielding film thus obtained had a thickness of 42 nm. With respect to light of wavelength 193 nm, the film had an optical density OD of 3.05, a reflectance of 42% at the substrate side surface, and a reflectance of 43% at the surface remote from the substrate.

Figure 3:
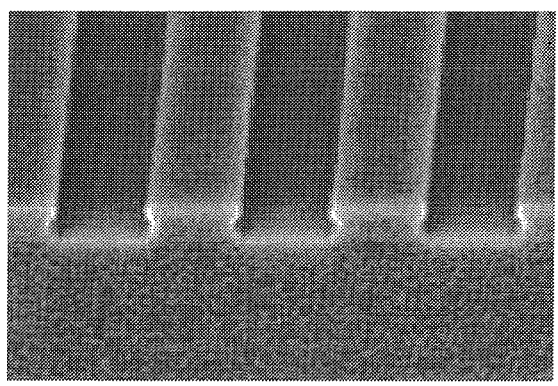
FIG. 3 is a SEM image of a light-shielding film pattern obtained in Comparative Example 1.
Figure 4A:
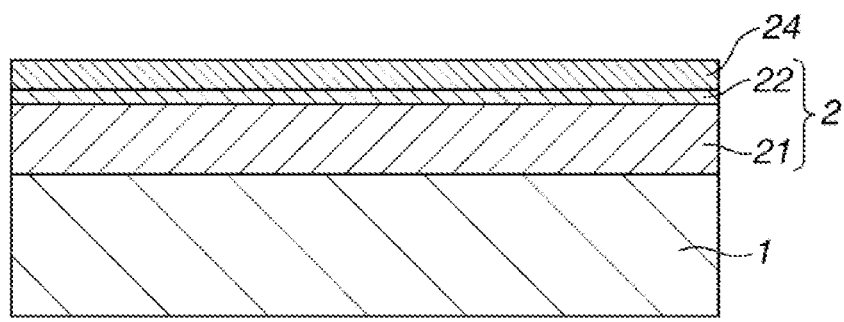
FIG. 4A and FIG. 4B illustrate in cross-sectional view exemplary binary photomask blanks in different embodiments of the invention, where each binary photomask blank has a hard mask film.
Figure 4B:
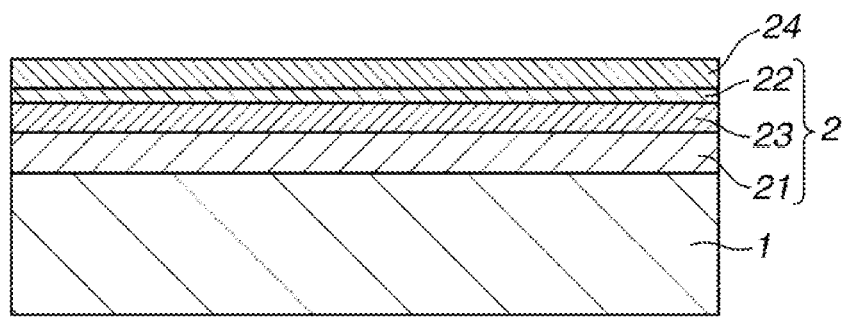

Next, a light-shielding film pattern was formed by the same procedure as in Example 1 aside from using the binary photomask blank thus obtained, and the cross-sectional profile thereof was observed under SEM. The SEM image is shown in FIG. 3. A less perpendicular cross-section was confirmed from the SEM observation.

Japanese Patent Application No. 2010-175230 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A binary photomask blank comprising a transparent substrate and a light-shielding film thereon having an optical density of 2.5 to 3.5, wherein said light-shielding film i) consists of a substrate-side compositionally graded layer disposed contiguous to the transparent substrate, a surface-side compositionally graded layer disposed remote from the transparent substrate, or a substrate-side compositionally graded layer disposed contiguous to the transparent substrate, a surface-side compositionally graded layer disposed remote from the transparent substrate, and an intermediate layer in between the substrate-side compositionally graded layer and the surface-side compositionally graded layer, ii) has a thickness of 35 to 60 nm, and iii) is composed of a silicon base material containing a transition metal and nitrogen and/or oxygen, said substrate-side compositionally graded layer is a layer having a thickness of 10 to 58.5 nm in which the total content of nitrogen and oxygen increases in a thickness direction toward the transparent substrate, said substrate-side compositionally graded layer comprises iv) a layer whose composition varies continuously in the thickness direction, v) a combination of at least three layers each having a consistent composition, vi) a combination of a layer having a consistent composition with a layer whose composition varies continuously in the thickness direction, or vii) a combination of layers whose composition varies continuously in the thickness direction, the silicon base material of said substrate-side compositionally graded layer contains the transition metal and silicon in an atomic ratio from 1:2 to 1:9, the total content of nitrogen and oxygen in said substrate-side compositionally graded layer is 25 to 40 atom % at its surface contiguous to the transparent substrate and 10 to 23 atom % at its surface remote from the transparent substrate, said surface-side compositionally graded layer is a layer having a thickness of 1.5 to 6 nm in which the total content of nitrogen and oxygen decreases in the thickness direction toward the transparent substrate, said surface-side compositionally graded layer comprises a layer whose composition varies continuously in the thickness direction, a combination of at least two layers each having a consistent composition, a combination of a layer having a consistent composition with a layer whose composition varies continuously in the thickness direction, or a combination of layers whose composition varies continuously in the thickness direction, the silicon base material of said surface-side compositionally graded layer contains the transition metal and silicon in an atomic ratio from 1:2 to 1:9, the total content of nitrogen and oxygen in said surface-side compositionally graded layer is 10 to 45 atom % at its surface nearer to the transparent substrate and 45 to 55 atom % at its surface remote from the transparent substrate, and wherein said light-shielding film has a reflectance of up to 40% on both the front and back surfaces of the light-shielding film.

2. The binary photomask blank of claim 1, wherein said light-shielding film consists of said substrate-side compositionally graded layer, said surface-side compositionally graded layer and said intermediate layer.

3. The binary photomask blank of claim 1, wherein said substrate-side compositionally graded layer consists of iv) the layer whose composition varies continuously in the thickness direction, vi) the combination of the layer having the consistent composition with the layer whose composition varies continuously in the thickness direction, or vii) the combination of the layers whose composition varies continuously in the thickness direction.

4. The binary photomask blank of claim 1, further comprising a hard mask film of a chromium base material disposed on the light-shielding film.

5. The binary photomask blank of claim 1, wherein all the layers of the light-shielding film contain at least 3 atom % of nitrogen.

6. A method for manufacturing a binary photomask comprising the steps of forming a resist film having a thickness of up to 150 nm on the binary photomask blank of claim 1, processing the resist film into a resist pattern, and forming a mask pattern by using the resist pattern.

7. The binary photomask blank of claim 1, wherein the transition metal is molybdenum.

8. The binary photomask blank of claim 2, wherein the silicon base material of said intermediate layer contains the transition metal and silicon in an atomic ratio from 1:2 to 1:9, and the total content of nitrogen and oxygen in said intermediate layer is 10 to 23 atom %.

9. A binary photomask blank comprising a transparent substrate and a light-shielding film thereon having an optical density of 2.5 to 3.5, wherein said light-shielding film i) consists of a substrate-side compositionally graded layer disposed contiguous to the transparent substrate, a surface-side compositionally graded layer disposed remote from the transparent substrate, and an intermediate layer in between the substrate-side compositionally graded layer and the surface-side compositionally graded layer, ii) has a thickness of 35 to 60 nm, and iii) is composed of a silicon base material containing a transition metal and nitrogen and/or oxygen, said substrate-side compositionally graded layer is a layer having a thickness of 10 to 58.5 nm in which the total content of nitrogen and oxygen increases in a thickness direction toward the transparent substrate, said substrate-side compositionally graded layer comprises iv) a layer whose composition varies continuously in the thickness direction, v) a combination of at least three layers each having a consistent composition, vi) a combination of a layer having a consistent composition with a layer whose composition varies continuously in the thickness direction, or vii) a combination of layers whose composition varies continuously in the thickness direction, the silicon base material of said substrate-side compositionally graded layer contains the transition metal and silicon in an atomic ratio from 1:2 to 1:9, the total content of nitrogen and oxygen in said substrate-side compositionally graded layer is 25 to 40 atom % at its surface contiguous to the transparent substrate and 10 to 23 atom % at its surface remote from the transparent substrate, said surface-side compositionally graded layer is a layer having a thickness of 1.5 to 8 nm in which the total content of nitrogen and oxygen decreases in the thickness direction toward the transparent substrate, said surface-side compositionally graded layer comprises a layer whose composition varies continuously in the thickness direction, a combination of at least two layers each having a consistent composition, a combination of a layer having a consistent composition with a layer whose composition varies continuously in the thickness direction, or a combination of layers whose composition varies continuously in the thickness direction, the silicon base material of said surface-side compositionally graded layer contains the transition metal and silicon in an atomic ratio from 1:2 to 1:9, the total content of nitrogen and oxygen in said surface-side compositionally graded layer is 10 to 45 atom % at its surface nearer to the transparent substrate and 45 to 55 atom % at its surface remote from the transparent substrate, and wherein said light-shielding film has a reflectance of up to 40% on both the front and back surface of the lighl-shielding film.

10. The binary photomask blank of claim 9, wherein the silicon base material of said intermediate layer contains the transition metal and silicon in an atomic ratio from 1:2 to 1:9, and the total content of nitrogen and oxygen in said intermediate layer is 10 to 23 atom %.

11. The binary photomask blank of claim 9, wherein said substrate-side compositionally graded layer consists of iv) the layer whose composition varies continuously in the thickness direction, vi) the combination of the layer having the consistent composition with the layer whose composition varies continuously in the thickness direction, or vii) the combination of the layers whose composition varies continuously in the thickness direction.

12. The binary photomask blank of claim 9, further comprising a hard mask film of a chromium base material disposed on the light-shielding film.

13. The binary photomask blank of claim 9, wherein all the layers of the light-shielding film contain at least 3 atom % of nitrogen.

14. The binary photomask blank of claim 9, wherein the transition metal is molybdenum.

15. A method for manufacturing a binary photomask comprising the steps of forming a resist film haying a thickness of up to 150nm on the binary photomask blank of claim 9, processing the resist film into a resist pattern, and forming a mask pattern by using the resist pattern.

16. A binary photomask blank comprising prising a transparent substrate and a light-shielding film thereon having an optical density of 2.5 to 3.5, wherein said light-shielding film i) is formed of a substrate-side compositionally graded layer disposed contiguous to the transparent substrate, a surface-side compositionally graded layer disposed remote from the transparent substrate, or a substrate-side compositionally graded layer disposed contiguous to the transparent substrate, a surface-side compositionally graded layer disposed remote from the transparent substrate, and an intermediate layer in between the substrate-side compositionally graded layer and the surface-side compositionally graded layer, has a thickness of 35 to 60 nm, and iii) is composed of a silicon base material containing a transition metal and nitrogen and/or oxygen, said substrate-side compositionally graded layer is a layer having a thickness of 10 to 58.5 nm in which the total content of nitrogen and oxygen increases in a thickness direction toward the transparent substrate, said substrate-side compositionally graded layer comprises iv) a layer whose composition varies continuously in the thickness direction, v) a combination of at least three layers each having a consistent composition, vi) a combination of a layer having a consistent composition with a layer whose composition varies continuously in the thickness direction, or vii) a combination of layers whose composition varies continuously in the thickness direction, the silicon base material of said substrate-side compositionally graded layer contains the transition metal and silicon in atomic ratio from 1:2 to 1:9, the total content of nitrogen and oxygen in said substrate-side compositionally graded layer is 25 to 40 atom % at its surface contiguous to the transparent substrate and 10 to 23 atom % at its surface remote from the transparent substrate, said surface-side compositionally graded layer is a layer having a thickness of 1.5 to 6 nm in which the total content of nitrogen and oxygen decreases in the thickness direction toward the transparent substrate, said surface-side compositionally graded layer comprises a layer whose composition varies continuously in the thickness direction, a combination of at least two layers each having a consistent composition, a combination of a layer having a consistent composition with a layer whose composition varies continuously in the thickness direction, or a combination of layers whose composition varies continuously in the thickness direction, the silicon base material of said surface-side compositionally graded layer contains the transition metal and silicon in an atomic ratio from 1:2 to 1:9, the total content of nitrogen and oxygen in said surface-side compositionally graded layer is 10 to 45 atom % at its surface nearer to the transparent substrate and 45 to 55 atom % at its surface remote from the transparent substrate, and wherein said light-shielding film has a reflectance of up to 40% on both the front and back surfaces of the light-shielding film.

17. The binary photomask blank of claim 16, wherein said light-shielding film is formed of said substrate-side compositionally graded layer, said surface-side compositionally graded layer and said intermediate layer.

18. The binary photomask blank of claim 16, wherein said substrate-side compositionally graded layer consists of iv) the layer whose composition varies continuously in the thickness direction, i) the combination of the layer having the consistent composition with the layer whose composition varies continuously in the thickness direction, or vii) the combination of the layers whose composition varies continuously in the thickness direction.

19. The binary photomask blank of claim 17, wherein the silicon base material of said intermediate layer contains the transition metal and silicon in an atomic ratio from 1:2 to 1:9, and the total content of nitrogen and oxygen in said intermediate layer is 10 to 23 atom %.

* * * * *